(12) United States Patent
Huttunen

(10) Patent No.: US 6,771,718 B1
(45) Date of Patent: Aug. 3, 2004

(54) METHOD FOR FREQUENCY ERROR ESTIMATION

(75) Inventor: Mikko Huttunen, Espoo (FI)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/582,168

(22) PCT Filed: Dec. 21, 1998

(86) PCT No.: PCT/FI98/01008

§ 371 (c)(1),
(2), (4) Date: Jun. 22, 2000

(87) PCT Pub. No.: WO99/33217

PCT Pub. Date: Jul. 1, 1999

(30) Foreign Application Priority Data

Dec. 22, 1997 (FI) .................................................. 974598

(51) Int. Cl.[7] .............................................. H04L 27/06
(52) U.S. Cl. ...................................................... 375/344
(58) Field of Search ................................. 375/355, 371, 375/375, 344, 340; 455/192.2, 182.2; 329/318, 361

(56) References Cited

U.S. PATENT DOCUMENTS 6,032,033 A * 2/2000 Morris et al. ............ 455/277.2
6,104,767 A * 8/2000 Atarius et al. ............... 375/344
6,400,784 B1 * 6/2002 Ben-Eli ....................... 375/365

FOREIGN PATENT DOCUMENTS

EP 757 451 2/1997
EP 809 376 11/1997

OTHER PUBLICATIONS

Rocco Di Girolamo t al., "Performance of Open Loop Digital Frequency Estimation Techniques for Burst–Mode Transmission," European Transactions on Telecommunications, vol. 7, No. 6, Dec. 1996.

* cited by examiner

Primary Examiner—Stephen Chin
Assistant Examiner—Kevin Kim
(74) Attorney, Agent, or Firm—Pillsbury Winthrop LLP

(57) ABSTRACT

A method for estimating a frequency error in a communication system, in particular in a mobile communication system involving successively sampling sample sets from a signal to be received at given points corresponding to symbol sequence points of the receiver, and frequency error estimates corresponding to each point are determined based on the sample sets at the given points and variance of the frequency error estimates of every given point is calculated. The frequency error estimate of the signal to be received is selected based on the frequency error estimates of the given point whose variance is least.

4 Claims, 2 Drawing Sheets

METHOD FOR FREQUENCY ERROR ESTIMATION

BACKGROUND OF THE INVENTION

The invention relates to a method for estimating a frequency error in a communication system, in particular in a mobile communication system, in which method sample sets are successively sampled from a signal to be received at specific points corresponding to the symbol sequence points of a receiver and frequency error estimates that correspond to each sampling point are determined on the basis of the sample sets sampled at said sampling points.

When establishing a connection between two communication devices a receiving device has to become synchronized with a signal to be received in order that transmission of information would be possible. Particularly in mobile communication systems, in which intercommunicating devices have no separate synchronizing connection, but each device comprises an oscillator of its own, the frequencies of the devices need to be mutually synchronized when a connection is being established. For instance, in TETRA (Terrestrial Trunked Radio) system, when operating at a frequency of 400 MHz, a typical maximum deviation of a base station is ±40 Hz from the nominal frequency and the corresponding value of a terminal is ±800 Hz. If two terminals communicate with each other (a so-called direct-mode channel), the mutual frequency difference of the devices may at worst rise up to 1600 Hz. When the base station and the terminal communicate with each other, the difference may even in that case exceed 800 Hz. However, for the connection to work, the difference can be only about 300 Hz at most. When establishing a connection between two communication devices, first, the frequency error of a signal to be received as compared with the receiver frequency has to be determined and the frequency of the receiving device has to be tuned accordingly.

There are several known methods for detecting and compensating the frequency error. For instance, the receiver can be tuned to different frequencies until the correct frequency has been found. It is also known to sample the signal to be received and to estimate the signal frequency error on the basis of the samples, for instance, by means of a Fourier transformation or by using a MUSIC (Multiple Signal Classification) algorithm.

A drawback with these known methods is slowness. Traditionally, in cellular communications systems there is ample time to determine and compensate the frequency error of the signal to be received. Instead, in the new TETRA system, for instance, the call establishment is carried out considerably quicker than in previous systems and this sets stricter requirements for the time available for determining the frequency error. Particularly quick error determination is required when operating in direct-mode channel of the TETRA system. If the frequency error of the signal to be received is not determined and compensated in time, it may result in a total loss of incoming information.

BRIEF DESCRIPTION OF THE INVENTION

The object of this invention is to provide a method by means of which a frequency error of a signal to be received can be determined quickly with a sufficient accuracy, in order that a receiver could be tuned to a correct frequency prior to the actual transmission. This is achieved with the method of the invention, the method being characterized in that the variance of frequency error estimates of each sampling point is calculated and the frequency error estimate of the signal to be received is determined on the basis of the frequency error estimates of the sampling point with the least variance.

The method of the invention is based on the idea that variance is used for selecting the most reliable frequency error estimate from a plurality of estimates calculated on the basis of sample sets sampled from the signal. An advantage with the method is its quickness as compared with the previously known methods. In the TETRA system, a frequency error up to 2 kHz can be corrected with the method of the invention sufficiently quickly.

BRIEF DESCRIPTION OF THE DRAWINGS

In the following the invention will be described in greater detail in connection with preferred embodiments with reference to the accompanying drawings of which

DETAILED DESCRIPTION OF THE INVENTION

Figure 1:
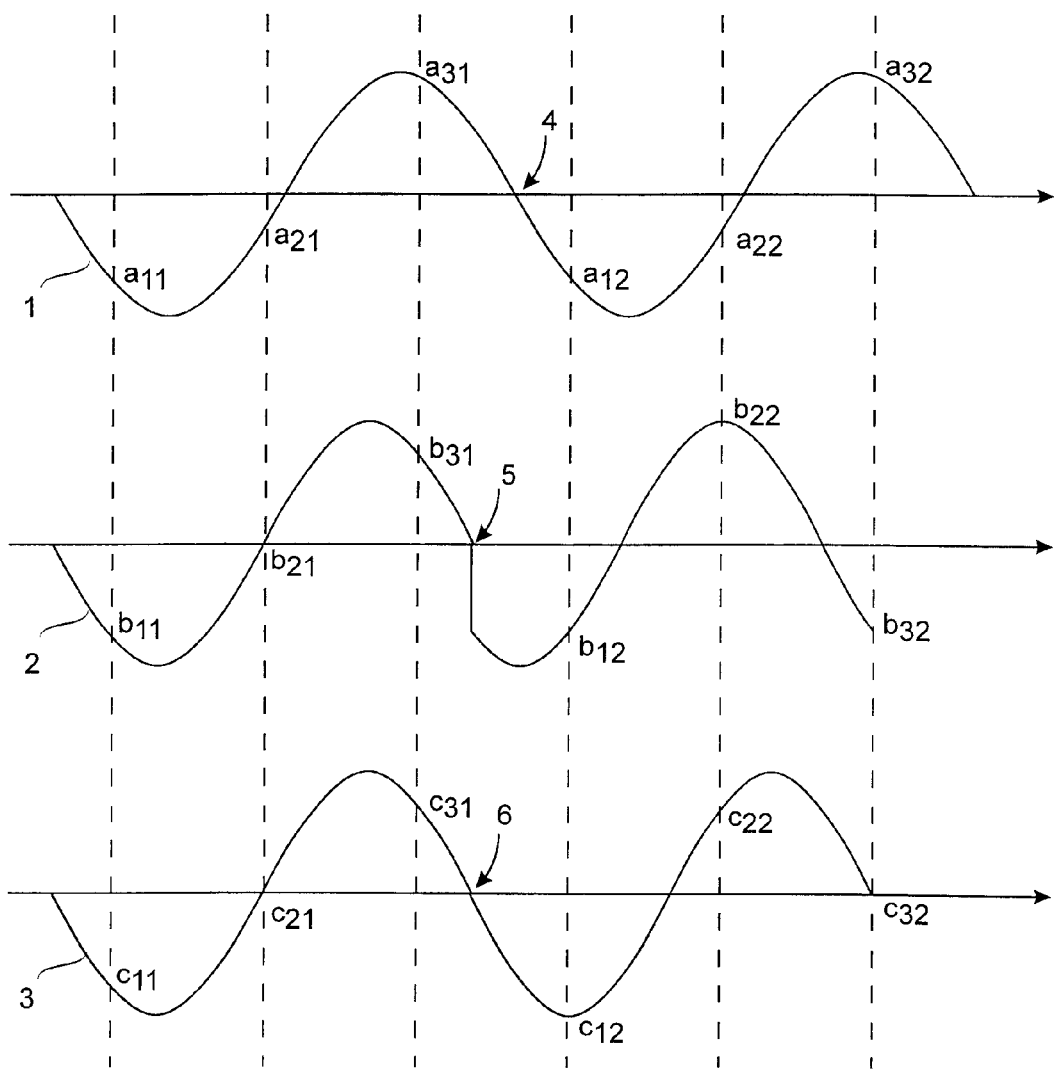
FIG. 1 illustrates signals of different types in a simplified manner.
Figure 2:
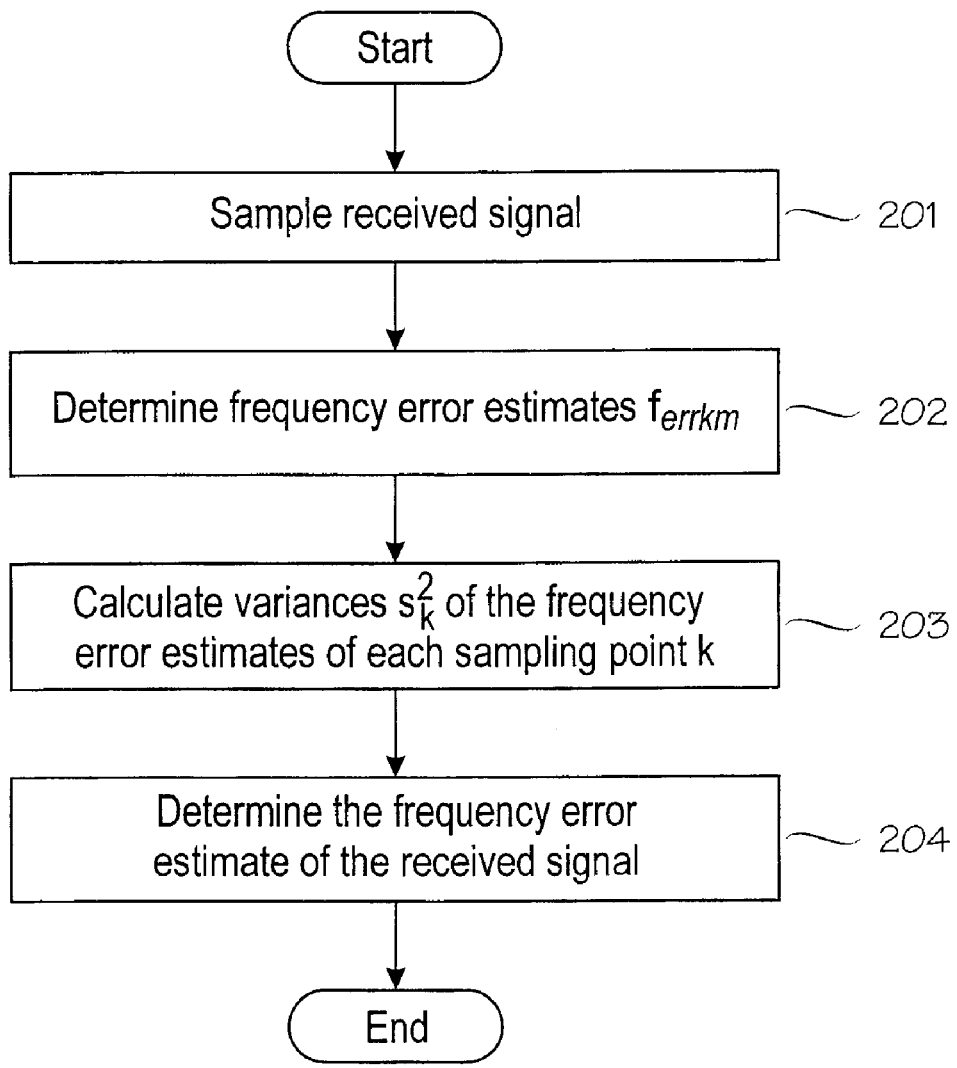
FIG. 2 is a flow diagram illustrating the invention.

The embodiment described herein illustrates the use of the method in connection with the TETRA system. The TETRA system employs $\pi/4$-DQPSK(Differential Quaternary Phase Shift Keying) modulation, whereby a digital signal is modulated to a carrier in two-bit sequences in such a way that a specific phase shift corresponds to each two-bit combination at the beginning of every symbol sequence. A symbol sequence refers to a signal sequence which is used for transmitting two bits. The phase shifts, which correspond to bit combinations 00, 01, 10 and 11, are $\pi/4$, $3\pi/4$, $-\pi/4$ and $-3\pi/4$. The symbol frequency used in the TETRA system is 18 kHz, and consequently the bit frequency is 36 kHz. In order that data communication would be possible between two communication devices, there must exist symbol synchronization between them, i.e. the receiving device must know the location of symbol sequences in the received signal, in order that demodulation would succeed. The FIG. 1 shows curves 1, 2 and 3 which illustrate three sinusoidal signals, each of which is two symbol sequences in length. The symbol sequence boundaries are at points 4, 5 and 6. The curve 1 illustrates a different frequency from the curves 2 and 3, due to which the symbol sequences of the curve 1 differ in length from the symbol sequences of the curves 2 and 3. The curve 2 employs $\pi/4$-DQPSK modulation and at the beginning 5 of the second symbol sequence a phase shift of $\pi/4$ occurs as compared with the curve 3, in which there is no modulation and consequently no phase shift occurs at the boundary 6 of the symbol sequences.

When establishing a connection, a transmitting mobile station first sends a synchronization burst. In the FIG. 1, the curve 1 illustrates the frequency signal of the receiver and the curve 3 that of the transmitter. The curve 2 illustrates the transmitter frequency signal that is modulated. For clarity, the curves are shown sine-shaped and the frequency difference between the transmitter and the receiver has been magnified. In the receiving mobile station, the received modulated signal 2 is sampled 201 at given points $b_{1n}$, $b_{2n}$ and $b_{3n}$ of the curve 2 which correspond to the points $a_{1n}$, $a_{2n}$ and $a_{3n}$, where n=1 . . . N and N is the number of samples, of the symbol sequence of the receiver frequency curve 1. So the sampling points in the received signal are determined on the basis of the receiver frequency, since the frequency of the received signal is not yet known accurately. There are for instance three sampling points per symbol sequence of the receiver, whereby the sampling frequency is 54 kHz at 18 kHz the symbol frequency. The accuracy of the frequency error estimate to be determined is the better, the more sampling points per symbol sequence. For instance a hundred samples are taken per sampling point, i.e. a hundred successive symbol sequences are sampled one sample each per every sampling point. Each of these sampling points is treated as if it were the optimum sampling point which symbol synchronization would generate in an ideal situation. In the ideal situation, the frequency of the signal to be received is known accurately, and likewise, the locations of the symbol sequences in the signal to be received are known. Thus only one sample per transmitter symbol sequence would be sufficient, since one can be certain that the signal is sampled at the right point.

Phase differences between corresponding sampling points in successive symbol sequences are calculated by subtracting from the phase of the sampling point the phase of the corresponding sampling point in the previous symbol sequence. In frequency error calculation, a symbol-sequence-specific phase shift caused by modulation has to be eliminated from the phase difference, so that that the phase difference would only represent the frequency error of the signal. This is effected by looking for the most probable phase shift ($\pi/4$, $3\pi/4$, $-\pi/4$ or $-3\pi/4$) which corresponds to the symbol sequence. When the phase difference caused by the signal frequency error is small as compared with the phase shift corresponding to the symbol sequence and hence its share of the calculated phase difference is small, the most probable phase shift corresponding to the symbol sequence can be deduced by examining which one of the four possible phase shifts ($\pi/4$, $3\pi/4$, $-\pi/4$ or $-3\pi/4$) of the symbol sequence is closest to the calculated phase difference. The deduced phase shift corresponding to the symbol sequence is subtracted from the calculated phase difference of the sampling points. The remaining phase difference $\Delta\theta_n$ represents the transmitter frequency deviation from the receiver frequency. In the FIG. 1, the curve 3 illustrates the received signal, from which modulation is removed, and the difference of the phases of the corresponding sampling points of the successive symbol sequences directly represents the signal frequency difference with respect to the reference signal 1. For instance, the difference of the phases of the sampling points $c_{12}$ and $c_{11}$ represents the frequency difference between the curves 1 and 3.

A frequency error estimate $f_{erk}$ corresponding to each sampling point k is calculated over a given time, i.e. over a given number of samples N, based on the phase change $\Delta\theta_n$ of the received signal per symbol sequence of the receiver, the symbol frequency being 18 kHz, with the following formula:

$$f_{errk} = \frac{\sum_{n=1}^{N} \Delta\phi_n}{2\pi} * 18000/N, \text{ where}$$

$k$ = sequence number of a sampling point;

$N$ = number of samples;

$\Delta\phi_n$ = signal phase shift per symbol sequence at a given sampling point.

The time required for calculation can be controlled by changing the number N of samples: the more samples are taken, the longer the calculation takes.

The above-described sampling 201 and frequency error fear determination are repeated, for instance, on three successive sample sets, whereby three frequency error estimates $f_{errkm}$, where k=1 . . . 3 and m=1. . . 3, are obtained 202 for each of the three sampling points. The average $\bar{x}_k$ of the frequency error estimates is calculated at every sampling point. Thereafter the variance of the frequency error estimates of each sampling point is calculated 203 with the general formula of variance:

$$s_k^2 = \frac{1}{3}\sum_{m=1}^{3} (f_{errkm} - \bar{x}_k)^2, \text{ where}$$

$k$ = sequence number of a sampling point;

$f_{errkm}$ = frequency error estimate $m$ at the sampling point $k$;

$\bar{x}_k$ = average of frequency error estimates at the sampling point $k$.

The average $\bar{x}_k$ of the frequency error estimates of that sampling point k, whose variance $s^2_k$ is least, is selected 204 as the final frequency error estimate. On the basis of the frequency error estimate thus obtained, the frequency of the receiver is adjusted sufficiently close to the frequency of the received signal, as a result of which the actual symbol synchronization begins.

Even though the method is described herein as applied in connection with the TETRA system, it does not in any way restrict the application of the method to other types of communication systems as well. The invention can be used in connection with various modulating and multiplexing methods and combinations thereof, without that the basic idea of the invention is changed. It is obvious to a person skilled in the art that as technology progresses the basic idea of the invention can be implemented in a variety of ways. Therefore, the invention and its embodiments are not restricted to the above-described examples, but they may vary within the scope of the appended claims.

What is claimed is:

1. A method for estimating a frequency error in a communication system, in particular in a mobile communication system, the method comprising obtaining successive sample sets from a received signal at specific sampling points corresponding to specific symbol sequence points of a frequency signal of a receiver;

determining frequency error estimates for each sampling point on the basis of the sample sets obtained at sampling point in question;

calculating the variance of frequency error estimates of each sampling point; and determining the frequency error estimate of the received signal on the basis of the frequency error estimates of that sampling point the variance of frequency error estimates of which sampling point is least.

2. The method of claim 1, wherein the average of the frequency error estimates determined from the sample sets of that sampling point the variance of frequency error estimates of which sampling point is least, is selected as the frequency error estimate of the received signal.

3. The method of claim 2, wherein there are three sampling points per symbol sequence.

4. The method of claim 3, wherein there are three sample sets per sampling point.

* * * * *